United States Patent
Kadotani (10) Patent No.: US 8,476,656 B2
(45) Date of Patent: Jul. 2, 2013

(54) LIGHT-EMITTING DIODE

(75) Inventor: Norikazu Kadotani, Tsu (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 829 days.

(21) Appl. No.: 12/563,302

(22) Filed: Sep. 21, 2009

(65) Prior Publication Data

US 2010/0072502 A1   Mar. 25, 2010

(30) Foreign Application Priority Data

Sep. 25, 2008   (JP) .................... 2008-246580

(51) Int. Cl.
*H01L 33/00*  (2010.01)
(52) U.S. Cl.
USPC ........... 257/98; 257/99; 257/100; 257/625; 257/675; 257/796; 257/E23.101
(58) Field of Classification Search
USPC ............ 257/98–100, 625, 675, 796, E23.101
See application file for complete search history.

(56) References Cited

U.S. PATENT DOCUMENTS 7,300,182 B2 * 11/2007 Mazzochette ............ 362/294
2007/0235739 A1 * 10/2007 Sun et al. .................... 257/79

FOREIGN PATENT DOCUMENTS

| JP | 2000216443 | 8/2000 |
|---|---|---|
| JP | 2007-043125 | 2/2007 |
| JP | 2007129053 | 5/2007 |
| JP | 2007-266631 | 10/2007 |
| JP | 2007-273592 | 10/2007 |
| WO | 2008/084882 | 7/2008 |

OTHER PUBLICATIONS

Translation of Notification of Reasons for Rejection issued on Jul. 12, 2012, in corresponding Japanese patent application JP 2008-246580 (4 pages).

* cited by examiner

*Primary Examiner* — Samuel Gebremariam
(74) *Attorney, Agent, or Firm* — Browdy and Neimark, PLLC (57) ABSTRACT

A light-emitting diode includes a circuit board, a pair of electrodes provided on the circuit board, at least one light-emitting diode element electrically connected to the pair of electrodes, a central electrode for heat-dissipation, provided between the pair of electrodes on the circuit board, and a heat-dissipation plate disposed on the central electrode for heat-dissipation and including a reflection surface. The central electrode for heat-dissipation includes an upper central electrode disposed on the upper surface of the circuit board and a lower central electrode disposed on the lower surface of the circuit board and the upper central electrode thermally connected to the lower central electrode.

10 Claims, 5 Drawing Sheets

LIGHT-EMITTING DIODE

CROSS-REFERENCE TO THE RELATED APPLICATION

The application is based on and claims the priority benefit of Japanese Patent Application No. 2008-246580, filed on Sep. 25, 2008, the entire descriptions of which are incorporated herein by reference.

BACKGROUND OF THE INVENTION

1. Field of the Invention

The present invention relates to a light-emitting diode (LED) capable of being mounted on a motherboard of lighting devices, information terminal devices or the like, more specifically to an LED for illumination having, in particular, high brightness and excellent heat-dissipation properties.

2. Description of the Related Art

LEDs have been widely employed in various electrical devices as small electronic parts for illumination due to their long operational life, small size, high emission efficiency, low power consumption or the like.

LEDs can be easily solder-mounted on a surface of a motherboard of the devices by using a mounter and achieve an excellent mass-productivity of devices including LEDs, which are used, for example, illumination keys of mobile phones of small information terminal devices, light sources of lighting devices or light sources of liquid crystal backlights. LEDs with higher brightness, longer operational life and higher reliability are required.

One proposal for a conventional surface-mount LED is disclosed in Japanese Patent Application Publication No. 2000-216443 (see page 3 of the specification and FIG. 1). The proposed surface-mount LED includes a board made of a metallic thin plate, a reflection cup provided on the board and having an inverted conical recess, formed by a press process, an LED element disposed in the reflection cup, a first resin including a light collecting lens part disposed above the LED element and configured to seal the LED element, and a second resin configured to reinforce a back surface of the board.

With the above structure, because the LED element is placed on the board made of the metallic thin plate having a high heat-conducting efficiency, heat-generation of the LED element is transmitted through the board to a motherboard and dissipated thereon, thereby it is possible to curb the reduction of brightness of emitted light and increase a life span of the LED element.

A conventional LED as a light emitting device as disclosed in Japanese Patent Application Publication 2007-129053 (page 5, FIG. 3) has a structure including a base made of a material having a high heat conductivity and provided with a predetermined conductive pattern, a circuit board attached to the base and having an opening, an LED element die-bonded on the base at a position where the opening of the circuit board is disposed, upper electrodes provided on the LED element and wire-bonded to the predetermined pattern of the circuit board through gold wires, a case with a lens, attached to an outer circumferential edge portion of an upper surface of the circuit board to cover the LED element and having a sealing resin injection hole provided on an outer circumferential portion of the case, and a sealing resin formed by a resin injected from the sealing resin injection hole to cover the LED element. In the structure, because the base mounting the LED element is formed by an aluminum plate to which alumite treatment is applied, or a copper plate on which aluminum plating is applied, the structure has excellent corrosion resistance of a reflection surface, a high reflectance, and excellent heat-dissipation properties and is able to curb brightness deterioration due to heat because heat generation of the LED element is directly transmitted to the base.

However, in the conventional LED as disclosed in Japanese Patent Application No. 2000-216443, because the board is formed in a complicated shape including the reflection cup having a step, a conical recess and so on, from the metallic thin plate by way of the press forming, the board is easily deformed and lacks strength due to a characteristic of the press forming, and this gives rise to structural problems such as the need to reinforce the board made of the metallic thin plate by attaching a reinforced resin member to a back surface of the board or the like, thereby resulting in an increment in production costs due to an increased number of processes. In addition, because the board must be formed by a thin plate capable of being formed by the press, the board necessarily has a high heat resistance, and there is a problem with heat conductivity, possibly resulting in brightness deterioration.

On the other hand, in the conventional LED as disclosed in Japanese Patent Application Publication No. 2007-129053, because the LED element is disposed in the opening of the circuit board, light emitted from the LED element, especially, light emitted from a side surface of the LED element is almost all shielded by a wall of the opening of the circuit board. Consequently, there is a problem that the LED has a low light extraction efficiency. In addition, in the LED element, because the base is made of a metallic material such as aluminum or the like, electrodes cannot be formed directly on the metallic base and the electrodes (lower electrodes) used as mount-terminals when the LED is mounted on the motherboard by soldering cannot be formed on the base, and therefore, with such a structure, there is a problem that a surface-mount LED cannot be provided and therefore the use is very limited.

SUMMARY OF THE INVENTION

An object of the present invention is to provide an LED including a heat-dissipating device that absorbs heat generated by an LED element efficiently, and to provide the LED preventing brightness deterioration due to heat-causing discoloration, and achieving a high light-emission efficiency.

To accomplish the above object, an LED according to one embodiment of the present invention includes a circuit board, a pair of electrodes provided adjacent to opposite sides on the circuit board, at least one light-emitting diode element electrically connected to the pair of electrodes, a central electrode for heat-dissipation provided between the pair of electrodes on the circuit board, and a heat-dissipation plate having a height and a reflection surface at least formed on an upper surface of the heat-dissipating plate, and the heat-dissipating plate disposed on the central electrode.

The light-emitting diode element is disposed on the upper surface of the heat-dissipation plate and electrically connected to the pair of electrodes on the circuit board by a pair of wires.

The pair of electrodes each including an upper electrode provided on an upper surface of the circuit board and a lower electrode provided on a lower surface of the circuit board and the upper electrode electrically connected to the lower electrode, the upper electrodes and the lower electrodes of the pair of electrodes disposed adjacent to the opposite sides on the circuit board.

The central electrode for heat-dissipation including an upper central electrode disposed between the upper electrodes of the pair of electrodes and a lower central electrode disposed between the lower electrodes of the pair of electrodes on the lower surface of the circuit board and the upper central electrode thermally connected to the lower central electrode.

DETAILED DESCRIPTION OF THE PREFERRED EMBODIMENTS

Preferred embodiments of the present invention will be explained in detail hereinafter with reference to the accompanying drawings.

First Embodiment

Figure 1:
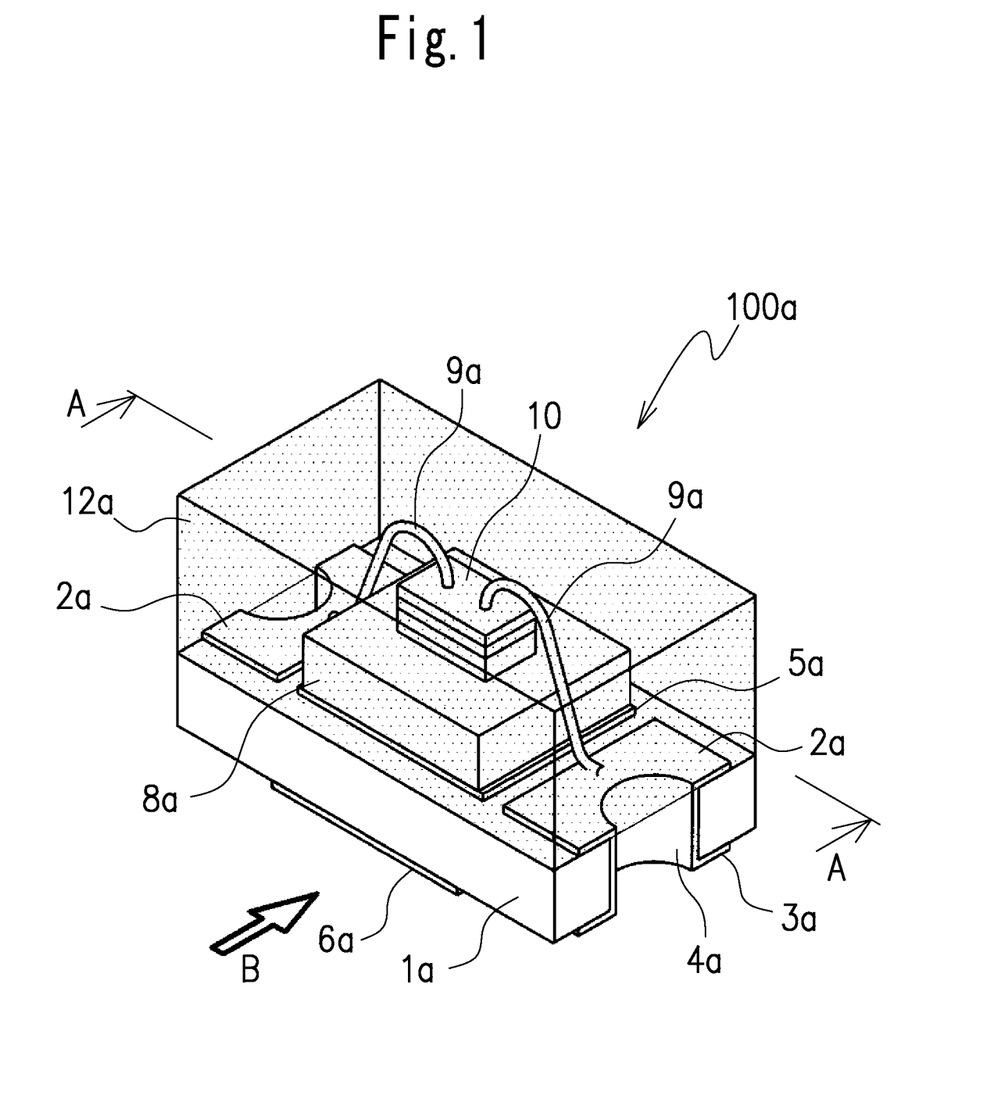
FIG. 1 is a perspective view showing a structure of an LED according to a first embodiment of the present invention.
Figure 2:
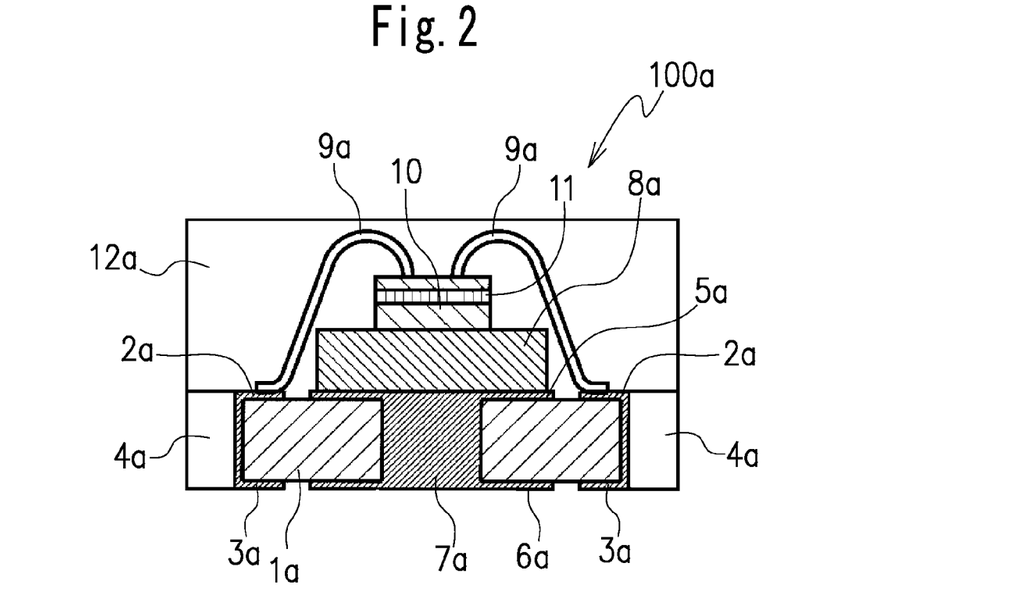
FIG. 2 is a sectional view taken along line A-A in FIG. 1, showing the LED according to the first embodiment of the present invention.
Figure 3:
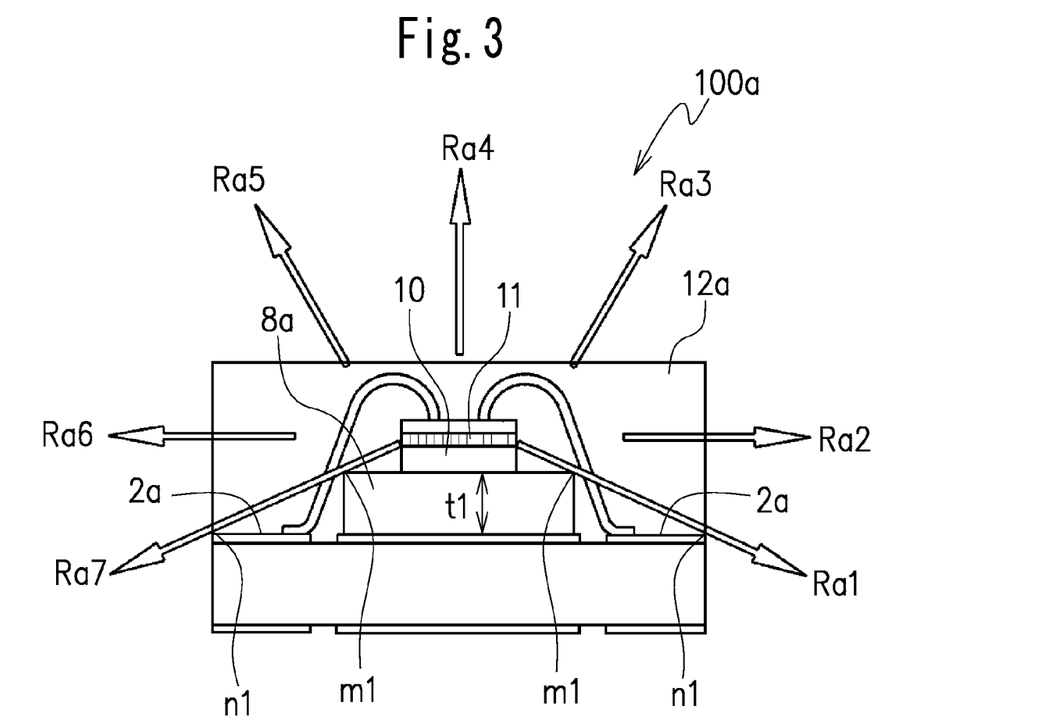
FIG. 3 is a front view as viewed from a direction of arrow B in FIG. 1, showing the LED according to the first embodiment of the present invention in a state where light is radiated from an LED element.

FIGS. 1 to 3 illustrate a light-emitting diode (hereinafter, referred to as LED) according to a first embodiment of the present invention.

The LED 100*a* in the first embodiment includes a circuit board 1*a*, a heat-dissipation plate 8*a* provided on one surface, for example, an upper surface (as viewed in FIG. 2) of the circuit board 1*a*, at least one light-emitting diode element (hereinafter, referred to as LED element) 10 provided on the heat-dissipation plate 8*a*, and a light-transmitting resin 12*a* provided on the upper surface of the circuit board 1*a* to seal the LED element (see FIG. 1).

A pair of electrodes that are electrically connected to the LED element 10 are provided adjacent to opposite sides on the circuit board 1*a*. The pair of electrodes in an embodiment comprise, for example, a pair of upper electrodes 2*a* provided at opposite ends of the upper surface of the circuit board 1*a*, the LED element 10 being disposed between the pair of upper electrodes, and a pair of lower electrodes 3*a* provided at opposite ends of a lower surface of the circuit board 1*a*, as shown in FIGS. 1 and 2. The respective facing upper and lower electrodes 2*a* and 3*a* in a vertical direction of FIGS. 1 and 2 are electrically connected to each other by semi-circular through-holes 4*a* provided at the opposite sides of the circuit board 1*a*. A central electrode for heat-dissipation is provided between the pair of electrodes at a position of the circuit board where the LED element 10 is mounted. The central electrode for heat-dissipation includes a central upper electrode 5*a* disposed between the pair of upper electrodes on the upper surface of the circuit board 1*a* and a lower electrode 6*a* disposed between the pair of lower electrodes on the lower surface of the circuit board 1*a* and the upper central electrode being thermally connected by a filled via 7*a* to the lower central electrode 5*a*. The heat-dissipation plate 8*a* is disposed on the upper central electrode 5*a* for heat-dissipation.

Note that the upper central electrode 5*a* and the lower central electrode 6*a* constitute a heat-dissipation device, which is described hereinafter.

The LED element 10 is disposed on an upper surface of the heat-dissipation plate 8*a*, as shown in FIG. 2. An anode electrode and a cathode electrode (not shown) provided on an upper surface of the LED element 10 are electrically connected to the pair of upper electrodes 2*a*, respectively, through a pair of bonding wires 9*a*, for example. More specifically, one of the bonding wires 9*a* is connected at one end thereof to the anode electrode of the LED element 10 and at another end thereof to the corresponding one upper electrode 2*a*. The other bonding wire 9*a* is connected at one end thereof to the cathode electrode of the LED element 10 and at another end thereof to the corresponding other upper electrode 2*a*.

The light-transmitting resin 12*a* is configured to seal the upper surface of the circuit board 1*a*, the pair of upper electrodes 2*a* for electrical connection, the upper electrode 5*a* to mount a heat-dissipation plate 8*a* thereon, the heat-dissipation plate 8*a*, the LED element 10, and the bonding wires 9*a*.

The circuit board 1*a* is made of, for example, a plate-like glass epoxy material. The heat-dissipation plate 8*a* has a reflection surface, a heat-dissipation property, and may have a property of being chemically stable, for example, deterioration-resistant. More specifically, the heat-dissipation plate 8*a* is formed by a material having both of a reflection function and a heat-dissipation function (heat conductivity) such as an aluminum thin plate or the like having a high reflectance, in which, for example, an increased reflection treatment is applied to the aluminum thin plate. The heat-dissipation plate 8*a* also has a reflection surface provided on the upper surface where the LED element 10 is disposed. Consequently, light emitted downwardly from a light-emission surface 11 of the LED element 10 is reflected on the reflection surface provided on the upper surface of the heat-dissipation plate 8*a*, and heat from the LED element 10 is released to the heat-dissipation plate 8*a*.

The heat-dissipation plate 8*a* is adhesively fixed to the upper surface of the upper central electrode 5*a* for heat-dissipation by way of, for example, a silicon-based adhesive, epoxy-based adhesive, polyolefin-based adhesive sheet or the like having good heat-dissipation properties and high heat-conductivity. The LED element 10 is adhesively fixed to the upper surface of the heat-dissipation plate 8*a* through, for example, an adhesive similar to the aforementioned adhesives.

The circuit board 1*a* is provided with a heat-dissipation device to release heat emitted from the LED element 10 to exterior of the LED. The heat-dissipation device includes, for example, the upper central electrode 5*a* for heat-dissipation, which is provided on the circuit board 1*a* and on which the LED element 10 is disposed, the lower electrode 6*a* for heat-dissipation, provided on the lower surface of the circuit board 1*a*, and the filled via 7*a* provided in and passing through a central portion of the circuit board 1*a* and configured to thermally connect the upper central electrode 5*a* and the lower central electrode 6*a* (see FIG. 2). The pair of lower electrodes 3*a* electrically connected to the LED element 10 and the lower central electrode 6*a* thermally connected to the LED element 10 are used as mount-terminals when the LED 100*a* is surface-mounted on a motherboard (not shown) by a solder.

Next, heat conductivity of the LED 100a according to the present invention is described.

When a driving current is applied to the pair of lower electrodes 3a of the LED 100a, the light-emission surface 11 of the LED element 10 emits light. Heat generated by the light-emission of the LED element is transmitted to the heat-dissipation plate 8a made of an aluminum material or the like having good heat absorption and heat conductivity through the upper electrode 5a, the filled via 7a and the lower electrode 6a to electrodes of the motherboard (not shown), and thus, a great deal of heat is diffused. That is to say, the aforementioned heat-conduction path is formed through the circuit board 1a to have a shortest distance from the LED element to the motherboard for heat release, and hence the short path restrains its heat resistance small.

Consequently, even if the LED element 10 having a high brightness is lighted up and produces heat, because the heat is rapidly absorbed in the heat-dissipation plate and released to the motherboard, and thus, the rapid heat dissipation is available, and it is possible to provide a stable LED preventing from luminous deterioration due to the generation of heat even if it has a high brightness. In addition, because the heat-dissipation plate 8a is chemically stable, a reduction in reflectance due to discoloration can be prevented, for example.

Meanwhile, a certain amount of heat from the light-emission surface 11 can be absorbed by the heat-dissipation plate 8a. Since the heat-dissipation plate 8a has a thickness that increases a heat capacity of the heat-dissipation plate 8a, it is possible to achieve an improvement in characteristics of the heat-dissipation plate 8a during pulse lighting of the LED element, in other words, during pulse instantaneous lighting when instantaneous heat generated by the LED element at the time that the LED element performs an instantaneous high brightness lighting of flash or the like, is absorbed in the heat-dissipation plate 8a.

Note that, in the present embodiment, although the filled via 7a is provided in the circuit board to further improve heat-dissipation properties of the LED, the filled via is not necessarily required, and also, a circuit board having a high heat-dissipation property such as a ceramic circuit board may be substituted for the circuit board 1a provided with the filled via 7a. In addition, it is also possible to sufficiently absorb heat generated in the LED element simply by thickening or increasing a height of the heat-dissipation plate 8a to increase the heat capacity.

Next, radiated directions and radiated ranges of lights emitted from the emission surface 11 of the LED element 10 are described with reference to FIG. 3.

Lights are emitted from the light-emission surface 11 or pn-junction of the LED element 10 in all directions if there is no interrupter. Side and downward light Ra1 emitted from the light-emission surface 11 passes over a ridge line m1 of the heat-dissipation plate 8a in the transmitting resin 12a and a ridge line n1 of the upper electrode 2a of the circuit board 1a, to be radiated outside the LED 100a. In other words, a thickness or height of the heat-dissipation plate 8a is set to t1 (see FIG. 3) so that a level of the LED element 10 is set to a predetermined height, whereby the sideward and downward light Ra1 emitted from the light-emission surface 11 of the LED element is outwardly radiated, without being interrupted by the ridge line n1 of the upper electrode 2a. The thickness or height t1 of the heat-dissipation plate 8a may be set so that an upper corner of the heat-dissipation plate 8a is positioned above a virtual line joining a corner of the light-emission surface 11 and an upper corner of the circuit board. Also, the area of the heat-dissipation plate is set so that a corner of the heat-dissipation plate is positioned above a virtual line joining a corner of the light-emission surface of the light-emitting diode element and a corner of the circuit board.

Similarly, setting the thickness of the heat-dissipation plate 8a to t1 causes sideward and downward light Ra7 emitted from the light-emission surface 11 also to be radiated outside the LED 100a, without being interrupted by the ridge line n1 of the upper electrode 2a. On the other hand, lights emitted from the light-emission surface 11 in a direction lower than that of the lights Ra1 and Ra7 are reflected on the reflection surface of the heat-dissipation plate 8a of good reflectivity and radiated upwardly as shown by reflected lights Ra3 to Ra5, and sideward lights are radiated in directions of Ra2 and Ra6, respectively.

Consequently, the lights emitted in all directions from the light-emission surface 11 of the LED element 10 can be radiated in directions as shown by Ra1 to Ra7 without being interrupted by the circuit board 1a constituting the LED. Thereby, it is possible to provide an LED having a wide directivity for illumination, a high extraction efficiency of light and producing a large amount of light.

As mentioned above, by using the aluminum thin plate having a high reflectance provided with the increased reflection treatment as the material of the heat-dissipation plate 8a, because the heat-dissipation plate 8a has a reflectance similar to silver with respect to light emitted from the LED element 10 whereas it deteriorates no differently from silver, it is possible to provide an LED in which optical deterioration characteristics are significantly improved.

Second Embodiment

Next, a second embodiment of the LED according to the present invention is described.

Figure 4:
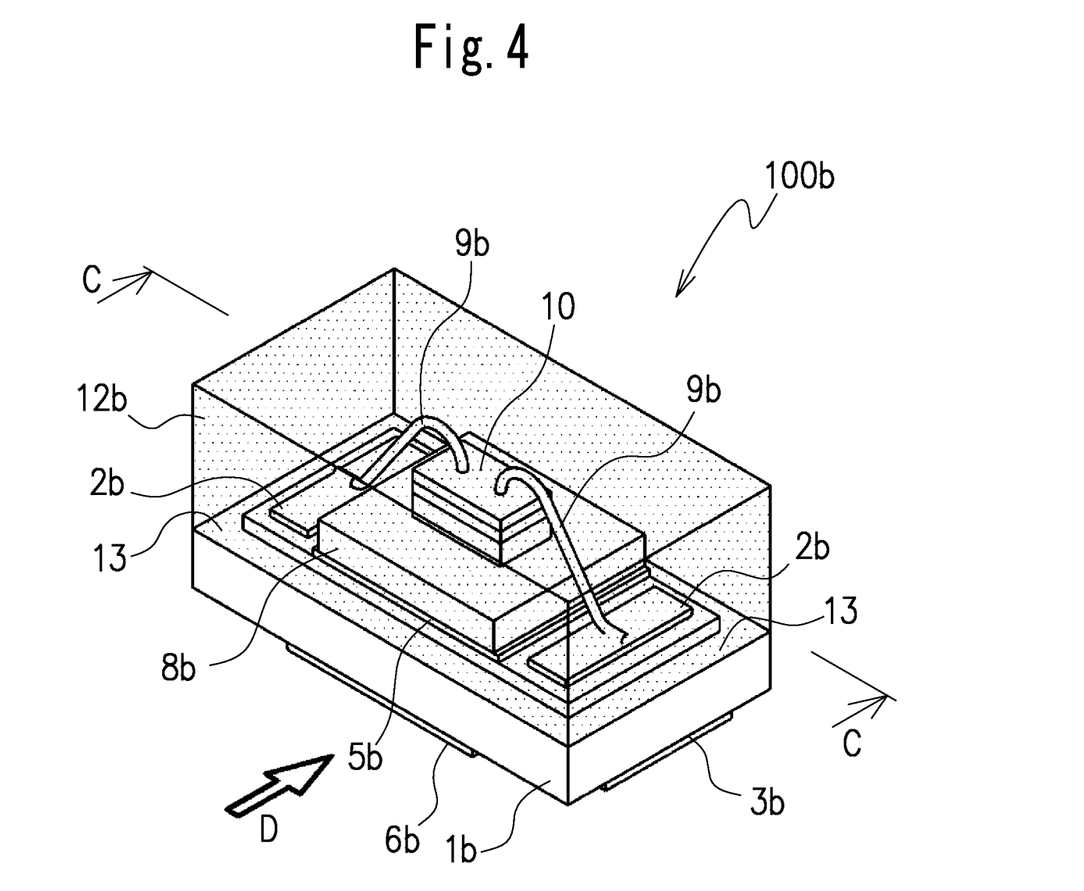
FIG. 4 is a perspective view showing a structure of an LED according to a second embodiment of the present invention.
Figure 5:
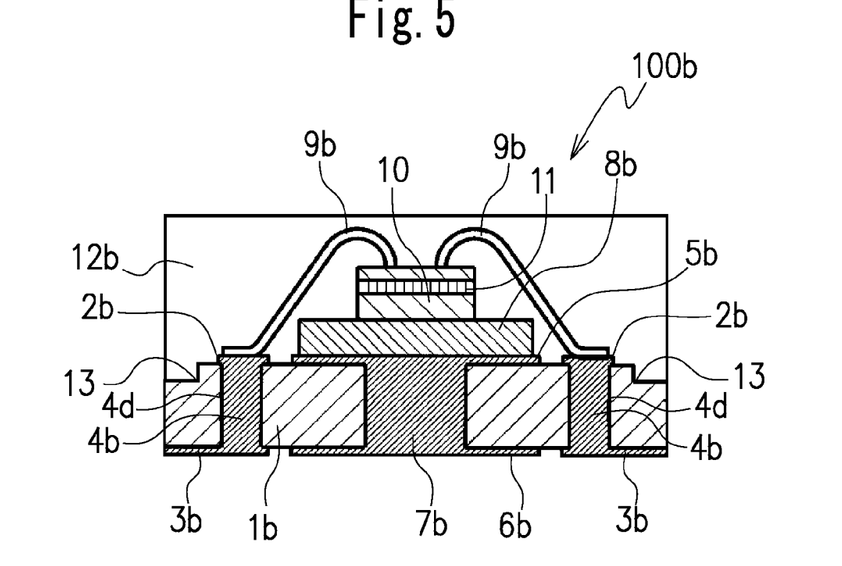
FIG. 5 is a sectional view taken along line C-C in FIG. 4, showing the LED according to the second embodiment of the present invention.
Figure 6:
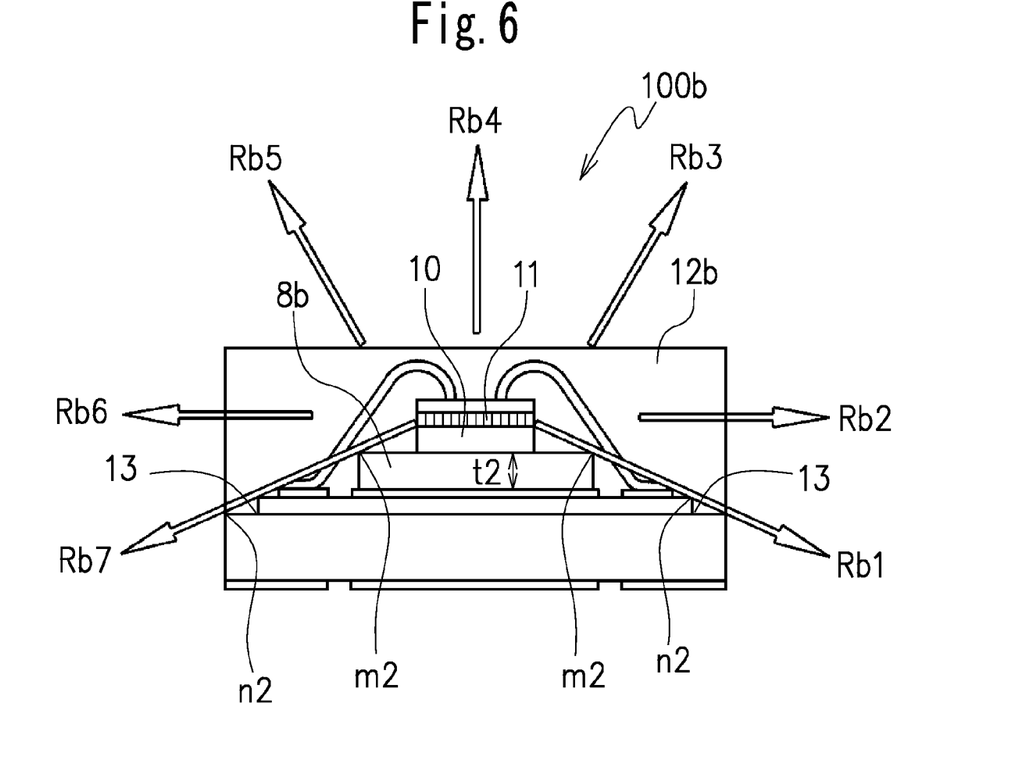
FIG. 6 is a front view as viewed from a direction of arrow D in FIG. 4, showing the LED according to the second embodiment of the present invention in a state where light is radiated from the LED element.

FIGS. 4 to 6 illustrate a structure of an LED 100b according to the second embodiment of the present invention.

A first point in which the LED 100b in the second embodiment differs from the LED 100a in the first embodiment is in that a step 13 is provided on a circumferential edge portion of a circuit board 1b similar to the circuit board 1a. According to the provision of the step 13, a structure and a shape of electrodes, and an external shape of a heat-dissipation plate 8b slightly differ from the electrodes and the heat-dissipation plate 8a, respectively.

As shown in FIG. 4, in the LED 100b, a light-transmitting resin 12b is configured to seal an upper surface of the circuit board 1b, the step 13, upper electrodes 2b, an upper central electrode 5b for heat-dissipation on which an LED element 10 is disposed, the heat-dissipation plate 8b, the LED element 10 and bonding wires 9b.

A second point in which the LED 100b differs from the LED 100a in the first embodiment is in that each of the upper electrodes 2b is electrically connected through a filled via 4b or cylindrical through-hole 4d to each of lower electrodes 3b. That is to say, because the step 13 is provided on the circumferential edge portion of the upper surface of the circuit board 1b, the filled vias 4b or the cylindrical through-holes 4d passing through the circuit board 1b upwardly and downwardly are substituted for the semi-circular through-holes 4a (see FIG. 1) provided in the opposite end portions of the circuit board 1a for electrically connecting the upper and lower electrodes 2a and 3a. In this embodiment, a heat-dissipation device similar to that in the first embodiment is provided. The heat-dissipation device in this embodiment includes the upper central electrode 5b for heat-dissipation disposed on the upper surface of the circuit board 1b, a lower central electrode 6b disposed on a lower surface of the circuit board 1b, and a filled via 7b provided in a central portion of the circuit board 1b and configured to thermally connect the upper central electrode 5b and the lower central electrode 6b. The lower electrodes 3b and the lower central electrode 6b are disposed on the lower surface of the circuit board 1b, these lower electrodes 3b and the lower central electrode 6b being used as terminals for mounting the LED 100b on a motherboard (not shown) by soldering.

Next, heat conductivity of the LED 100b in the second embodiment is described.

Components related to the heat conductivity of the LED are the heat-dissipation plate 8b, the upper central electrode 5b, the filled via 7b and the lower central electrode 6b. Because these components are the same as those described in the first embodiment, a repeated description is omitted. However, the important point is that, since a heat-conducting path is formed in a shortest distance (straight line) from the LED element to the motherboard, the heat-resistance is very small.

Consequently, even if the LED element 10 emits with a high brightness, similarly to the first embodiment, heat generated in the motherboard can be conducted and diffused rapidly, and hence it is possible to provide an LED 100b having a stable brightness with no deterioration due to heat-generation.

Next, lights emitted from the light-emission surface 11 of the LED element 10 are described, similarly to the first embodiment with reference to FIG. 6.

Lights are radiated from the light-emission surface 11 of the LED element 10 in all directions.

Sideward and downward light Rb1 emitted from the light-emission surface 11 passes over a ridge line m2 of the heat-dissipation plate 8b in the transmitting resin 12a and a ridge line n2 of the step 13 of the circuit board 1b, to be radiated outside the LED 100b. In other words, the sideward and downward light Rb1 emitted from the light-emission surface 11 is radiated outside the LED 100b, without being interrupted by the ridge line n2 of the step 13 of the circuit board 1b by setting a thickness or height of the heat-dissipation plate 8b to t2 (see FIG. 6).

Similarly, sideward and downward light Rb7 emitted from the light-emission surface 11 also can be radiated outside the LED 100b, without being interrupted by the ridge line n2 of the step 13. On the other hand, similarly to the first embodiment, lights emitted from the light-emission surface 11 in a direction lower than that of the lights Rb1 and Rb7 are reflected on a surface of the heat-dissipation plate 8b of good reflectivity and radiated in a direction as shown by reflected lights Rb3 to Rb5, and sideward lights are radiated in directions of Rb2 and Rb6, respectively.

Consequently, even in this embodiment, similarly to the first embodiment, the lights emitted in all directions from the light-emission surface 11 of the LED element 10 can be radiated in the directions of Rb1 to Rb7 without being interrupted by the circuit board 1b of the LED 100b itself. Thereby, it is possible to provide an LED having a wide directivity for illumination, a high extraction efficiency of light and a producing large amount of light.

In addition, the provision of the step 13 on the circumferential edge portion of the circuit board 1b makes it possible to form the heat-dissipation plate 8b having the thickness t2 smaller than the thickness t1 (see FIG. 3) of the heat-dissipation plate 8a in the first embodiment, by an amount corresponding to a wide and a depth of the step 13. Consequently, the LED 100b has a height that is lower in accordance with the reduced thickness of the heat-dissipation plate and can be miniaturized.

Furthermore, by providing the step 13 on the circumferential edge portion of the upper surface of the circuit board 1b, because the light-transmitting resin 12b sealing the LED element 10 and the bonding wires 9b covers the step 13, it is possible to achieve a large contacting area between the light-transmitting resin 12b and the circuit board 1b, whereby enabling improvement in peel strength therebetween.

Third Embodiment

Next, a third embodiment to realize an LED of an even higher output or higher watt type, according to the present invention is described.

Figure 7:
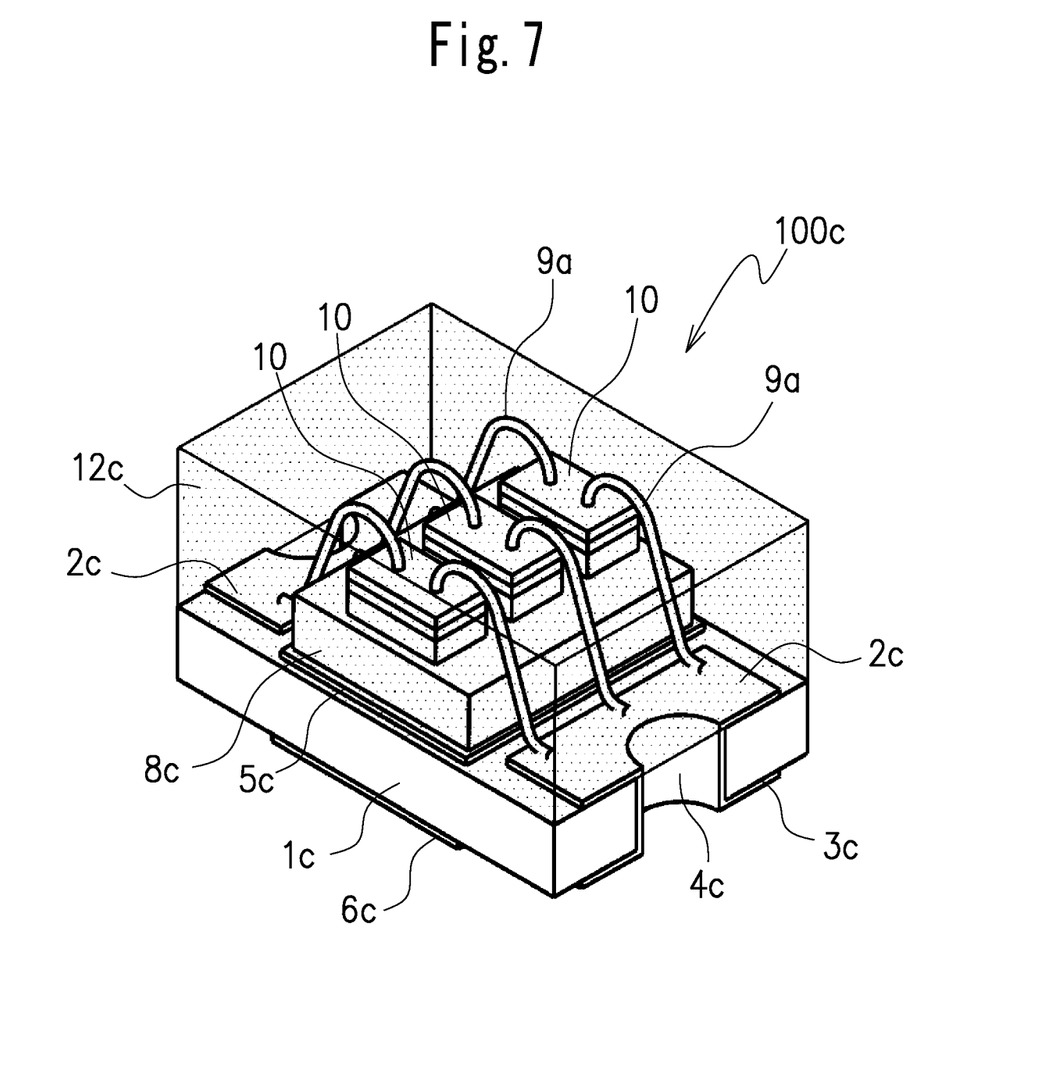
FIG. 7 is a perspective view showing a structure of an LED according to a third embodiment of the present invention.

FIG. 7 illustrates a structure of an LED 100c according to the third embodiment of the present invention. Because the LED 100c is the same in basic structure as the LED 100a in the first embodiment as shown in FIG. 1, identical reference numbers are attached to similar parts to those in the first embodiment, and a repeated description is omitted.

A point in which the LED 100c differs from the LED 100a is in that a plurality of LED elements 10 are disposed on and fixed to a heat-dissipation plate 8c. An external dimension of each of the heat-dissipation plate 8c, the circuit board 1c, the electrodes of this embodiment is configured to be larger than the respective those of the heat-dissipation plate 8a, the circuit board 1a, the electrode terminals, and so on, as shown in FIG. 1, because a plurality of LED elements 10 are included in the LED 100c in FIG. 7.

As shown in FIG. 7, the LED 100c has the circuit board 1c, upper electrodes 2c, an upper central electrode 5c for heat-dissipation, the heat-dissipation plate 8c, the plurality of LED elements 10, and bonding wires 9a configured to be sealed by a light-transmitting resin 12c.

Semi-circular through-holes 4c provided at opposite ends of the circuit board 1c are configured to electrically connect the upper electrodes 2c and lower electrodes 3c. A filled via (not shown) provided in a central portion of the circuit board 1c is configured to thermally connect the upper central electrode 5c for heat-dissipation and a lower central electrode 6c for heat-dissipation. The lower electrodes 3c and the lower central electrode 6c for heat-dissipation are thus used as mount-terminals by which the LED 100c can be mounted on a motherboard (not shown) by soldering.

Next, heat conductivity of the LED 100c according to the third embodiment is described.

A great deal of heat generated by high brightness light emission of the plurality of LED elements 10 is absorbed by the heat-dissipation plate 8c made of an aluminum material having good heat-conductivity, is conducted to the upper central electrode 5c, the filled via (not shown), and the lower central electrode 6c, and arrives at the motherboard (not shown), whereby a great deal of heat is diffused. Here, since a heat conducting path is formed in a shortest distance from the LED element to the motherboard, heat resistance is clearly very small.

Consequently, even if the plurality of LED elements are assembled in the LED, because excellent heat dissipation to the motherboard can be achieved, it is possible to provide an LED that prevents deterioration in brightness by curbing a rise in temperature, and has a high light extraction efficiency, a high wattage and a high brightness.

The LED according to the third embodiment of the present invention has a structure similar to that of the first embodiment. However, the structure of the second embodiment, that is to say, the structure in which the step is provided on the circumferential edge portion of the upper surface of the circuit board may be used for the LED of the third embodiment.

As mentioned above, in the LED according to each of the embodiments of the present invention, because the LED includes the circuit board which is disposed in a lowest portion thereof, the heat-dissipation plate disposed on and fixed to the upper surface of the circuit board and having reflectivity and chemical stability, and the LED element disposed on and fixed to the upper surface of the heat-dissipation plate, it is possible to provide an LED which is capable of being mounted using soldering on a motherboard of an information terminal devices or the like by way of a mounter, has a high light extraction efficiency due to the heat-dissipation plate, a stable heat-dissipation effect, chemical stability and a high brightness, and is capable of significantly improving the reduction in reflectance of a circumferential part of the LED element due to discoloration and the suppression of brightness deterioration due to heat from the LED element.

Although the preferred embodiments of the present invention have been described, it should be understood that the present invention is not limited to these embodiments, and that various modifications and changes can be made to the embodiments.

What is claimed is:

1. A light-emitting diode, comprising:
   a circuit board;
   a pair of electrodes provided adjacent to opposite sides on the circuit board;
   at least one light-emitting diode element electrically connected to the pair of electrodes;
   a central electrode for heat-dissipation provided between the pair of electrodes on the circuit board; and
   a heat-dissipation plate having a treated surface of increased reflection at least formed on an upper surface of the heat-dissipation plate, and
   the heat-dissipation plate being disposed on the central electrode,
   the light-emitting diode element being disposed on the upper surface of the heat-dissipation plate and electrically connected to the pair of electrodes on the circuit board by a pair of wires,
   the pair of electrodes each including an upper electrode provided on an upper surface of the circuit board and a lower electrode provided on a lower surface of the circuit board and the upper electrode electrically connected to the lower electrode, the upper electrodes and the lower electrodes of the pair of electrodes disposed adjacent to the opposite sides on the circuit board.

2. The light-emitting diode according to claim 1,
   the central electrode for heat-dissipation including an upper central electrode disposed between the upper electrodes of the pair of electrodes and a lower central electrode disposed between the lower electrodes of the pair of electrodes on the lower surface of the circuit board and the upper central electrode thermally connected to the lower central electrode.

3. The light-emitting diode according to claim 2, further comprising
   a through-hole thermally connecting the upper central electrode and the lower central electrode.

4. The light-emitting diode according to claim 2, further comprising
   a filled via thermally connecting the upper central electrode and the lower central electrode.

5. The light-emitting diode according to claim 1, further comprising
   a light-transmitting resin sealing the upper surface of the circuit board, the heat-dissipation plate, the light-emitting diode element, and the wires.

6. The light-emitting diode according to claim 1,
   wherein the light-emitting diode element includes a light-emission surface,
   wherein the height of the heat-dissipation plate is set so that a corner of the heat-dissipation plate is positioned above a virtual line joining a corner of the light-emission surface of the light-emitting diode element and a corner of the circuit board.

7. The light-emitting diode according to claim 1,
   wherein the light-emitting diode element includes a light-emission surface, wherein the area of the heat-dissipation plate is set so that a corner of the heat-dissipation plate is positioned above a virtual line joining a corner of the light-emission surface of the light-emitting diode element and a corner of the circuit board.

8. The light-emitting diode according to claim 1,
   wherein the heat-dissipation plate is made of an aluminum thin plate.

9. A light-emitting diode, comprising:
   a circuit board;
   a pair of electrodes provided adjacent to opposite sides on the circuit board;
   at least one light-emitting diode element electrically connected to the pair of electrodes;
   a central electrode for heat-dissipation, provided between the pair of electrodes on the circuit board; and
   a heat-dissipation plate with a surface of increased reflection treatment at least formed on an upper surface of the heat-dissipation plate, and the heat-dissipation plate being made of aluminum and disposed on the central electrode,
   the light-emitting diode element being disposed on the upper surface of the heat-dissipation plate and electrically connected to the pair of electrodes on the circuit board by a pair of wires,
   the pair of electrodes each including an upper electrode provided on an upper surface of the circuit board and a lower electrode provided on a lower surface of the circuit board and the upper electrode electrically connected to the lower electrode, the upper electrodes and the lower electrodes of the pair of electrodes disposed adjacent to the opposite sides on the circuit board, the central electrode for heat-dissipation including an upper central electrode disposed between the upper electrodes of the pair of electrodes and a lower central electrode disposed between the lower electrodes of the pair of electrodes on the lower surface of the circuit board and the upper central electrode thermally connected to the lower central electrode.

10. The light-emitting diode of claim 1
    wherein the treated surface of the heat-dissipation plate has a reflectance similar to silver with respect to light emitted from the light-emitting diode.

* * * * *